(12) United States Patent
Kalkowski et al.

(10) Patent No.: US 8,081,317 B2
(45) Date of Patent: Dec. 20, 2011

(54) ELECTROSTATIC CHUCK WITH ANTI-REFLECTIVE COATING, MEASURING METHOD AND USE OF SAID CHUCK

(75) Inventors: Gerhard Kalkowski, Jena (DE); Olaf Stenzel, Bucha (DE); Wieland Stöckl, Jena (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 239 days.

(21) Appl. No.: 12/436,252

(22) Filed: May 6, 2009

(65) Prior Publication Data

US 2009/0279101 A1    Nov. 12, 2009

(30) Foreign Application Priority Data

May 8, 2008   (DE) .......................... 10 2008 022 792

(51) Int. Cl.
*G01B 11/02*     (2006.01)
*F23Q 3/00*      (2006.01)

(52) U.S. Cl. ........................................ 356/511; 361/234

(58) Field of Classification Search .................. 356/512, 356/511; 361/234
See application file for complete search history.

(56) References Cited

U.S. PATENT DOCUMENTS

| | | | |
|---|---|---|---|
| 5,515,167 A * | 5/1996 | Ledger et al. | 356/505 |
| 5,753,132 A * | 5/1998 | Shamouilian et al. | 216/33 |
| 6,284,085 B1 | 9/2001 | Gwo | |
| 6,908,716 B2 | 6/2005 | Chan | |
| 2003/0180634 A1 | 9/2003 | Buxbaum et al. | |
| 2007/0128528 A1 | 6/2007 | Hess et al. | |
| 2008/0151467 A1* | 6/2008 | Simpson | 361/234 |
| 2008/0185960 A1* | 8/2008 | Koshiyama | 313/512 |
| 2009/0161285 A1* | 6/2009 | Abouaf et al. | 361/234 |

* cited by examiner

Primary Examiner — Michael A Lyons
(74) Attorney, Agent, or Firm — Young Basile

(57) ABSTRACT

The embodiments disclosed herein relate to an electrostatic chuck, or an optically structured element or an optical mask that comprise a metal film as well as a transparent cover applied on a substrate. At least two anti-reflective films are inserted between the metal film and the cover that reduce the reflectance of the metal film, as viewed from the surface, to almost zero. As a result, a direct interferometer measurement of the surface structure of the transparent cover is possible. Methods of measurement and of use are also disclosed.

21 Claims, 4 Drawing Sheets

US 8,081,317 B2

ELECTROSTATIC CHUCK WITH ANTI-REFLECTIVE COATING, MEASURING METHOD AND USE OF SAID CHUCK

CROSS-REFERENCES TO RELATED APPLICATION

This application claims priority from German Patent Application Serial No. 10 2008 022 792.7, filed on May 8, 2008, which is incorporated herein in its entirety by reference.

TECHNICAL FIELD

The present invention relates to an electrostatic chuck, or an optically structured element or an optical mask that comprises a metal film applied to a substrate as well as a transparent cover.

BACKGROUND

Anti-reflective coatings for glass surfaces, employing destructive interference of the reflection from thin, transparent films are known from H. A. MacLeod, "Thin Film Optical Filters", 3rd edition, (2001) IOP Publishing, Bristol and Philadelphia. In essence, the anti-reflective effect is achieved by stacking alternating layers of high- and low-refractive materials of a suitable thickness (where here "refraction" means the optical index of refraction at the selected wave length that can also be complex valued (E. Hecht, A. Zajac, "Optics", Addison-Wesley (1977)).

Until now, the preference has been to use tantalum pentoxide ($Ta_2O_5$) as the highly refractive material, while $SiO_2$ is frequently used as the low-refractive material.

Electrostatic chucks of glass or glass ceramic for lithographic applications have a highly reflective metal electrode, typically a thin Cr film that lies from a few 10 µm up to about 500 µm below the surface. The electrode reflects incident light more strongly than the glass layer above it. Structures and properties of the surface are thus "difficult" to recognize visually/measure optically because they are "drowned" in the scattered light.

When illuminated with unpolarized light, the reflectance of the surface of an $SiO_2$ glass body in air is about 4% in the visible range, while the reflectance of an embedded (bonded) metallic chromium film is about 60% and thus far "outshines" the surface.

In order to measure the chuck surface using interferometry (Fizeau), a highly reflective metal film, as thin as possible, for example of silver or chromium, was vaporized or sputtered onto the (glass) surface and removed after the measurement by chemical etching. This method has a number of disadvantages:

(A) The temporary metal coating generates stresses that may result in a distortion or curvature of the surface and falsify any conclusions derived therefrom concerning the planarity or shape of the uncoated surface. This is known specifically from Cr coatings and is very pronounced, but also cannot be completely prevented, in the case of silver.

(B) Every surface can only be coated homogenously to a finite degree. Typically, metal film thicknesses of about 100 nm are required for planarity measurements that, with typical inhomegeneities in film thickness of 5 to 10%, induce errors in measurement of approximately 5 to 10 nm (independently of film stresses).

(C) The coating and the subsequent etching can cause undesirable changes in the original surface. The micro-roughness in particular of the glass surface can increase as the result of etching processes.

(D) The expenditure in equipment and time in producing a precision chuck surface is seriously hampered by the need for a suitable metallizing process (and a corresponding etching process afterwards) before each interferometry measurement. The result is a substantial increase in cost.

Consequently, it is desirable to take a direct interferometry measurement by furnishing the embedded metal film with an anti-reflective coating on its upper side without metallizing the surface beforehand. The anti-reflective effect must ensure, at least for a narrow range around a selected wavelength (measurement wave length of the interferometer being used) and for the range of almost perpendicular incident light, that only a negligibly small amount of light is reflected from the electrode (negligible relative to the reflection at the glass surface of approximately 4%).

BRIEF SUMMARY OF THE INVENTION

Consequently, it was the object of the present invention to provide an electrostatic chuck, or an optical mask, the surface topography and/or surface planarity of which can be determined by simple measuring methods. It was further the object of the present invention to provide a corresponding measuring method to measure the surface topography of the electrostatic chuck. An additional object of the present invention was to identify potential applications for the chuck.

One embodiment of an electrostatic chuck comprises a substrate; a base layer comprised of a metal applied on the substrate; a first film of a chromium oxide applied on at least a portion of the base layer; a second film of at least one of a silicon oxide and an aluminum oxide applied on at least a portion of the first film; and a transparent cover.

The electrostatic chuck can further comprise a third film of chromium oxide applied on at least a portion of the second film and/or a fourth film of at least one of silicon oxide and aluminum oxide applied on at least a portion of the third film.

The transparent cover can be selected, for example, from the group consisting of glass, glass ceramics, silicon dioxide, $CaF_2$, ZnSe, non-linear optical crystals, diamond, optical synthetics, and cyclo-olefin polymers and copolymers. The substrate can be selected, for example, from the group consisting of glass, glass ceramics, silicon dioxide, $CaF_2$, ZnSe, non-linear optical crystals, diamond, optical synthetics, polycarbonate, and cyclo-olefin polymers and copolymers. The base layer can be selected, for example, from materials from the group consisting of Ti, Cr, Ni, Mo, Ta, W, Al, Sn and alloys thereof, semi-conductors, and electrically conductive oxides.

BRIEF DESCRIPTION OF THE DRAWINGS

The present invention is explained in more detail on the basis of the following examples and the appended figures without the intent to restrict the invention to the special parameters illustrated here.

DETAILED DESCRIPTION OF EMBODIMENTS OF THE INVENTION

Figure 1:
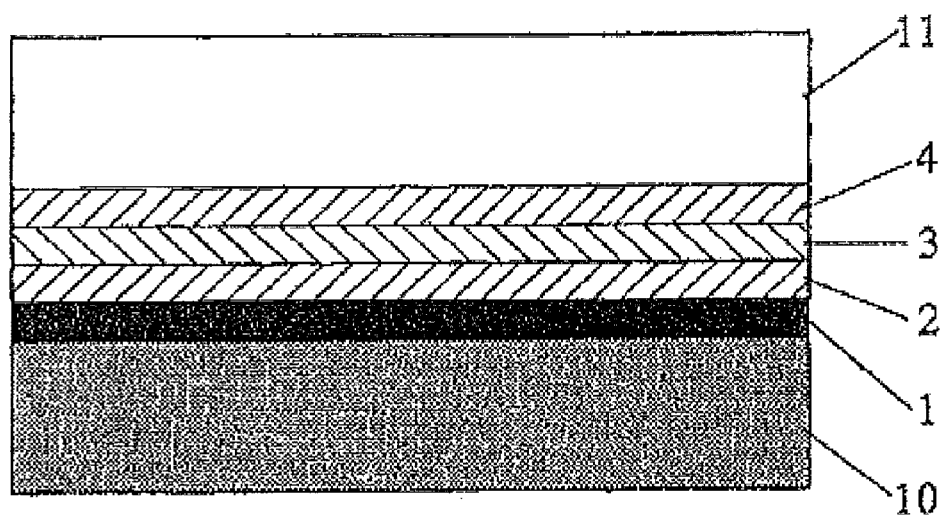
FIG. 1 shows a cross-section through a chuck in accordance with the invention with an anti-reflective coating formed of three films.

In accordance with the invention, an electrostatic chuck or an optical mask is prepared, comprising a base layer of metal, an alloy or a semi-conductor applied on a substrate and a transparent cover, wherein at least a first film of a chromium oxide and at least a second film of a silicon oxide and/or an aluminum oxide is applied as an anti-reflective film on the base layer and the transparent cover is configured as the final film. The structure of the electrostatic chuck is such that the first film is applied on the base layer and the second film is in turn applied on the first film. The base layer, first film and the second film are embedded between the substrate and the transparent cover. The at least one first and at least one second film comprising the anti-reflective coating can cover the base layer of metal completely so that the entire optical element has a markedly reduced ability to reflect. As an alternative, it is equally possible that the anti-reflective film is applied only partially to the base layer and reflectance there reduced, while the base layer causes high reflectance at the uncoated locations. In the last mentioned embodiment, it may be assumed that the cover is bonded over its entire surface or is directly bonded to the base layer at the points of the optical element that have an anti-reflective coating by optional means addressed in detail at a later point. The possibility also exists of bonding the cover only in the area of the anti-reflective coating or adhesively joining it thereto, while at the locations where the optical element has no anti-reflective coating a gap remains between cover and base layer (substrate).

The anti-reflective coating on chuck electrodes has not been customary until now, nor has the use of chromium oxide as a highly refractive material for interference coat systems. Chromium nitride has been used occasionally since it has a somewhat higher index of refraction than chromium oxide and is "more effective" as a result. Chromium nitride (as well as $Ta_2O_5$) is unsuitable for the present application because the electrical conductivity of these materials is relatively high. By contrast, $Al_2O_3$ films as a complete or partial replacement for $SiO_2$ are suitable in principle. Highly insulating coatings on the metal electrodes are important for electrical applications (specifically at high voltages such as the present electrostatic chucks) in order to prevent "charge carrier injections" into the glass or "charge carrier trapping" in the film or even flashovers between the individual electrodes in multi-polar electrode configurations. The natural passivation (oxidation) that takes place immediately in air when the film is discharged from the vacuum chamber is already being used for this purpose with sputtered Cr metal electrodes. The natural film of oxidation is, however, very thin and can easily be destroyed locally during subsequent coating.

The use of chromium oxide for the anti-reflective coating is thus particularly advantageous with respect to electrical functionality.

The use of chromium oxide on the chromium metal film is also particularly advantageous with respect to the natural chemical bond and adhesive strength of the oxide film on the metal.

The use of $Cr_2O_3$ or $SiO_2$ and/or $Al_2O_3$ for the respective films of the anti-reflective coating is similarly particularly advantageous with respect to electrical functionality since these materials also possess only very low electrical conductivity.

The use of $SiO_2$ in conjunction with chromium oxide is furthermore very advantageous regarding the adhesive strength of the oxides to each other since both oxides possess a covalent bonding character.

The result of this embodiment of an electrostatic chuck with the anti-reflective coating in accordance with the invention is that essentially only one reflection of light takes place at the surface of the transparent cover but hardly any corresponding reflection can be observed at the embedded film structure.

In complete contrast to the uncoated Cr metal area that has a reflectance of approximately 60%, the coated Cr area—depending on its specification—will have a reflectance <2%, preferably <0.2% in the equivalent wave length range.

Production of the anti-reflective coating is possible, for example, using PVD or sputtering with thin films of chromium oxide ($Cr_2O_3$) and silicon oxide ($SiO_2$) and/or aluminum oxide ($Al_2O_3$). These oxides both have electrically insulating properties as well as good adhesion to the Cr metal film, or to each other. The transparent cover, which is preferably selected from the group consisting of glass (boron float, fused silica . . . ), glass ceramics (e.g. Zerodur®), silicon carbide, $CaF_2$, ZnSe, non-linear optical crystals (e.g. potassium titanyl phosphate ($KTiOPO_4$)), lithium niobate, diamond, optical synthetics (e.g. poly(methyl methacrylate) (PMMA), polycarbonate (PC), cyclo-olefin polymers and/or copolymers (Zeonex®, Topas®, is bonded to the film structure. Bonding can be achieved, as an example, by use of an adhesive—except in the case of the synthetics or diamond—if necessary using other joining techniques as well, such as "wiring together" or "silicate bonding" using aqueous solutions (Dz-Huyng Gwo, "Ultra-Precise and Reliable Bonding Method," Sep. 4, 2001, U.S. Pat. No. 6,284,085), "direct bonding" (described in M. Alexe, U. Gösele, (eds.), "Wafer Bonding Applications and Technology," (2004), Springer Verlag) or "silicate bonding" (as described, for example, in U.S. Pat. No. 6,284,085). An adhesive must be used in the bonding process that has the same index of refraction optically as the adjacent transparent cover.

In the case of "silicate bonding" and "direct bonding", a film structure is advantageous in which the final anti-reflective film consists of $SiO_2$. This allows a relatively "homogenous" chemical joining of the transparent glass body to the anti-reflective film. In this, it is particularly advantageous that in the case of a bonded connection, the adhesive has essentially the same index of refraction (i.e. ±1%) as the transparent cover.

High-strength adhesive and electrically insulating cover films are created by all the methods named for producing the anti-reflective coating in accordance with the invention. Independently of the method of production, the resulting inventive advantage is that the reflectance for a selected wave length becomes almost zero.

As a result, optical measurements, such as the planarity, topography, etc., of the surface of the transparent cover close to the wavelength specified are possible without parasitic reflections or interference from the Cr metallic layer compromising or falsifying these measurements. Instead, the surface clearly "outshines" the residual reflection from the embedded metallic film.

The individual oxide films are sufficiently transparent and provide, with suitable film thickness and film sequence (because of their sharply differing optical indices of refraction in the visible range), a highly efficient anti-reflective/interference system to suppress the reflection from the metallic film thereunder.

In an advantageous embodiment, an additional, third film of chromium oxide is added on the second film. Even more advantageously, a fourth film of silicon oxide and/or aluminum oxide can be applied on this third film. Additional films in the aforementioned alternating sequence are also possible.

The use of SiO2 for the films of the anti-reflective coating, in particular when used as the final film, is especially suitable for the following applications of the technologies of "direct bonding" and "silicate bonding", since the necessary chemical composition (material property) is provided for the use of these technologies. An efficient and good connection of the sequence of films of the anti-reflective coating to the final, transparent cover is ensured.

In the experience of the inventors, an $SiO_2$ film thickness of 100 nm to 200 nm is sufficient for the subsequent "silicate bonding". This film structure opens up applications in which maximum stability, or use under severe alternating temperature loads or at temperatures far removed from ambient temperature is required, when bonded joints fail.

As a result, independently of the primary goal of optical anti-reflective advantages, additional advantages accrue for structural and joining applications if a final $SiO_2$ coating is provided either in the form of the multi-film structure described above or even simply as a coating of a chromium metallic film, or even as a coating of other metals, such as Ti, Cr, Ni, Mo, Ta, W, Al, Sn and/or alloys thereof, etc., or semi-conductors such as Si, Ge, GaAs, etc., or conductive oxides, such as ITO (indium tin oxide) or in other layered combinations with high-strength adhesive intermediate films.

The substrate to which the base layer and the anti-reflective coating are applied can preferably be selected from the group consisting of glass (boron float, fused silica . . . ), glass ceramic (e.g. Zerodur®, silicon dioxide, $CaF_2$, ZnSe, non-linear optical crystals (e.g. potassium titanyl phosphate ($KTiOPO_4$)), lithium niobate ($LiNbO_3$), barium borate ($BaB_2O_5$), etc., diamond, optical synthetics (e.g. poly(methyl methacrylate) (PMMA), polycarbonate (PC), cyclo-olefin polymers and/or copolymers (Zeonex®, Topas®).

Examples of film thicknesses for the individual layers described in the foregoing are as follows:

Base layer (of metal): 1 to 10,000 nm, preferably 10 to 1,000 nm, particularly preferably 20 to 200 nm; First film (chromiumn oxide): 30 to 120 nm, preferably 40 to 90 nm, particularly preferably 50 to 75 nm; Second film (silicon or aluminum oxide): 50 to 200 nm, preferably 5 to 35 nm, particularly preferably 50 to 75 nm; Third film (chromium oxide): 0.1 to 50 nm, preferably 5 to 35 nm, particularly preferably 10 to 20 nm; Fourth film (silicon and/or aluminum oxide): 1 to 10,000 nm, preferably 10 to 1,000 nm, particularly preferably 20 to 200 nm; Transparent cover (e.g. glass cover): 1 to 1,000 μm, preferably 5 to 500 μm, particularly preferably 10 to 200 μm.

Figure 3:
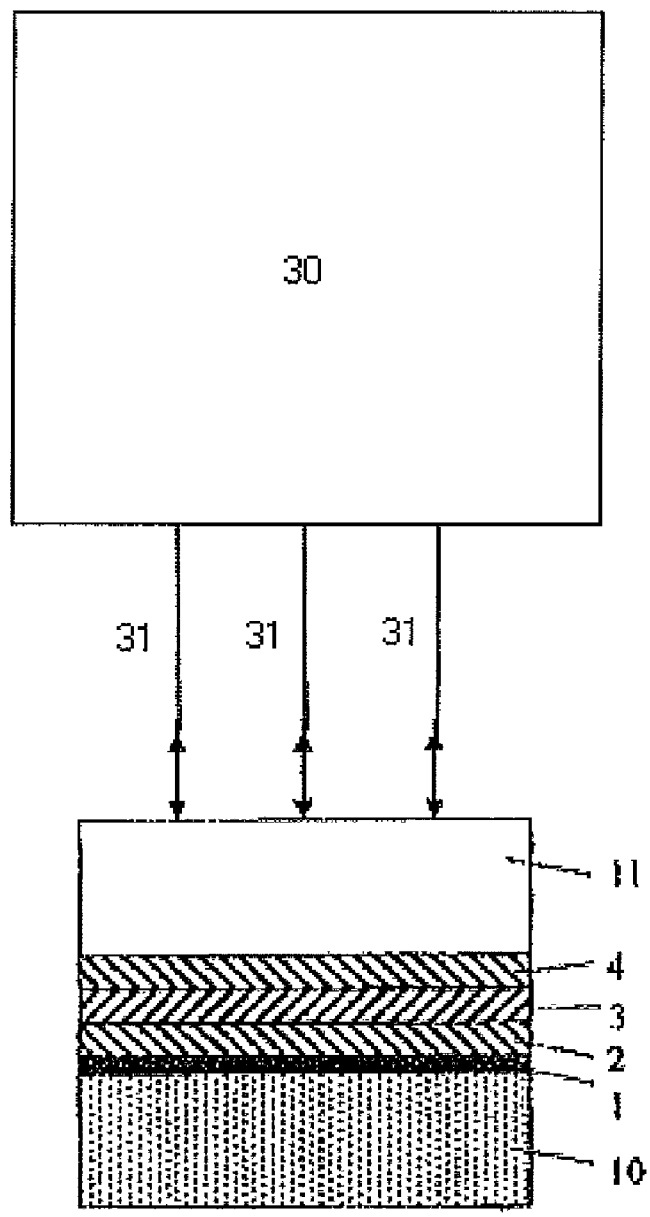
FIG. 3 illustrates an optical interferometric measuring method.

In accordance with the invention, a method for the topographical measurement of the surface of the transparent cover of a chuck or of an optically structured element in accordance with one of the previous claims with a Fizeau interferometer 30 is prepared. In this way, all the unevenesses or surface structuring of the transparent cover of the chuck can be overcome in just a single procedure without, as has been necessary from the prior art, having to apply additional metallic films on the surface of the transparent cover. In principle, the measurement is taken in such a way that the chuck is basically illuminated from a light source at a perpendicular angle onto the surface of the transparent cover, as shown in FIG. 3. The radiance is essentially reflected only through the surface of the transparent glass body. The portion of the light beam 31 passing through the transparent cover is eliminated by destructive interference at the anti-reflective coatings so that virtually no reflection can be observed from the intrinsically highly reflective metal electrode. The measurement of the surface can be made, therefore, simply and reliably in a single procedure in accordance with interoferometric principles known per se from the prior art using a Fizeau interferometer 30. A helium neon laser, for example, with a wave length of 632.8 nm can be used as a light source.

In accordance with the invention, applications for the chuck are provided, such as use in lithographic processes, in the processing of silicon or GaAs or glass wafers 90, in the handling (hold down, transportation . . . ) of such wafers or components that have been produced from such wafers in a vacuum or in an inert gas environment or in air, and/or for structured illumination.

The production method described in what follows is, for example, suitable for producing the film structures:

The chromium metal film is produced in an inert gas plasma (e.g. of argon) by means of DC magnetron sputtering, starting with a chromium metal target.

The following chromium oxide films are produced by means of reactive DC magnetron sputtering, similarly starting with a chromium target, preferably in an argon-oxygen plasma. The silicon oxide films are similarly produced by reactive DC magnetron sputtering. Particularly good film properties for both oxides can be achieved by means of dual magnetrons.

All the films are produced immediately one after the other in vacuum sequence. Dosing of the partial oxygen pressure and the adjustment of the corresponding energy parameters in the reactive sputtering processes are critical to achieving precise oxide films. The appropriate parameters will be somewhat different for the specific installations and are best determined through a prior series of tests. The technology of DC magnetron sputtering, or reactive DC magnetron sputtering, of optical films is essentially established prior art and is described comprehensively in A. Anders, "Handbook of Plasma Immersion, Ion Implantation and Deposition", John Wiley & Sons, New York.

The specific film thicknesses can be adjusted through the respective sputter times and should be determined in advance by test coatings and monitored by the known methods of film thickness monitoring.

Specific complex calculation indices for chromium metal and chromium oxide ($Cr_2O_3$), which can vary depending on the coating facility and process management, are used as the basis for the following examples for film thicknesses. If other values are available to the user, these are to be used and the film thicknesses affected must be modified in accordance with H. A. MacLeod, "Thin Film Optical Filters," 3rd edition, 2001, IOP Publishing, Bristol and Philadelphia.

The values used here for chromium oxide are—with wave length 632 nm–n–2.443 for the real part and k=0.2960 for the imaginary part. For chromium metal, the corresponding values are n=3.5346 and k=4.3614.

EXAMPLE 1

Film sequence for "thick" Cr film with the following film thicknesses:

| | |
|---|---|
| Base layer Cr metal | 100 nm |
| Chromium oxide ($Cr_2O_3$) | 68 nm |
| Silicon oxide ($SiO_2$) | 103 nm |
| Chromium oxide ($Cr_2O_3$) | 16 nm |

ULE ® glass cover (approx. 10μ or more)

EXAMPLE 2

Film sequence for "thin" Cr film with the following film thicknesses:

| | |
|---|---|
| Base layer Cr metal | 50 nm |
| Chromium oxide (Cr$_2$O$_3$) | 68 nm |
| Silicon oxide (SiO$_2$) | 101 nm |
| Chromium oxide (Cr$_2$O$_3$) | 17 nm |

ULE ® glass cover (approx. 10μ or more)

These two film sequences give a reflectance of typically <0.2% for the red wave length range 622 nm<lambda<643 nm (lambda=wavelength). Clearly, the film thickness of the Cr metal layer does not blend very gently into the film thicknesses of the two oxides.

However, it must taken into consideration that specific deposition conditions form the basis of these values, conditions that can still vary depending on the facility, the target material and process management.

In practice, the reflectance achieved in each case for a film sequence can depend delicately on the PVD deposition conditions since they directly influence the chemical composition and optical properties, such as index of refraction, etc., the film deposited and thus, ultimately, of the entire film system. This applies in particular to chromium oxide since the element chromium is known to occur in different valences and thus additional oxides can be present in addition to the primary (trivalent) (Cr$_2$O$_3$).

One skilled in the art knows that he has to understand the film thicknesses given to be reference points and if necessary vary them slightly to achieve the desired result for the anti-reflective property under his specific conditions.

Slightly different film thicknesses must be chosen for cover glasses other than the selected ULE® (ultra low expansion glass from Corning), depending on the index of refraction at the selected wavelength. For SiO$_2$ (fused silica) instead of ULE®, the following film sequence is recommended (which differs from the film sequence in accordance with Example 1):

EXAMPLE 3

Film sequence for "thick" Cr film with the following film thicknesses:

| | |
|---|---|
| Base layer Cr metal | 100 nm |
| Chromium oxide (Cr$_2$O$_3$) | 67 nm |
| Silicon oxide (SiO$_2$) | 103 nm |
| Chromium oxide (Cr$_2$O$_3$) | 16 nm |

Fused silica cover (approx. 10μ or more)

Adaptation of the anti-reflective properties to other wavelengths is possible by varying the film thicknesses. The following film structure has proved suitable for green light of wavelength approximately 535 nm:

EXAMPLE 4

Film sequence for "thick" Cr film with the following film thicknesses:

| | |
|---|---|
| Base layer Cr metal | 100 nm |
| Chromium oxide (Cr$_2$O$_3$) | 59 nm |
| Silicon oxide (SiO$_2$) | 79 nm |
| Chromium oxide (Cr$_2$O$_3$) | 15 nm |

Fused silica cover (approx. 10μ or more)

Obviously, it is primarily the film thicknesses of the two "inner" oxide films (4.2 and 4.3) that must be reduced in accordance with the shorter wavelength to a reflectance <0.2% for the green wave length range 526 nm<lambda<544 nm.

EXAMPLE 5

For methods such as "silicate bonding" or "direct bonding", it makes sense that the final (uppermost) film of the film system consists of SiO$_2$ to ensure a good bond to the subsequent cover glass. The following film structure is particularly suitable:

Film Sequence for "thick" Cr film for green or red light of the above wavelengths for silicate or direct bonding of the cover glass:

| | (green) | (red) |
|---|---|---|
| Base layer Cr metal | | 100 nm |
| Chromium oxide (Cr$_2$O$_3$) | 59 nm | 68 nm |
| Silicon oxide (SiO$_2$) | 80 nm | 104 nm |
| Chromium oxide (Cr$_2$O$_3$) | 14 nm | 16 nm |
| Silicon oxide (SiO$_2$) | | 100 nm |

ULE ® glass cover (approx. 10μ or more)

The deviations compared with the corresponding film sequences of Examples 4 and 1 consist in applying an additional SiO$_2$ film of approximately 100 nm wherein this film thickness is relatively uncritical and specifically can also be thicker to ensure a good chemical bond to the cover glass in silicate bonding.

Variations of this film structure to adapt to other wavelengths and to adapt to other cover glasses are undertaken by analogy with the examples described above by modifying the individual film thicknesses.

Through an even greater number of alternating films (with the correct film thicknesses), the anti-reflective area can be expanded further and possibly cover almost the entire visible wavelength range (see H. A. MacLeod "Thin Film Optical Filters", 3rd edition (2001) IOP Publishing, Bristol and Philadelphia).

Replacing the above SiO$_2$ films (individually or all together) with Al$_2$O$_3$ films is conceivable. Since the corresponding index of refraction of Al$_2$O$_3$ is somewhat higher than that for SiO$_2$, thinner film thicknesses are advantageous.

FIG. 1 shows an electrostatic chuck in accordance with the present invention that has a substrate 10 as the base structure that, as an example, can be formed of glass or ceramic, wherein the materials named here are not to be understood as restrictive examples.

A chromium metal film 1 that can function, for example, as an electrode is applied on this substrate. A film 2 of chromium oxide that is covered by a further film 3 of silicon oxide follows this chromium film. A further chromium oxide film is provided as an additional film 4. Here, the films 2, 3 and 4 form the anti-reflective coating, wherein it is essential to the invention that the materials have alternately high and low indices of refraction. A glass layer is provided as a final cover whose surface can now be studied by optical, interferometric measuring methods for planarity thanks to the anti-reflective coating.

Figure 2:
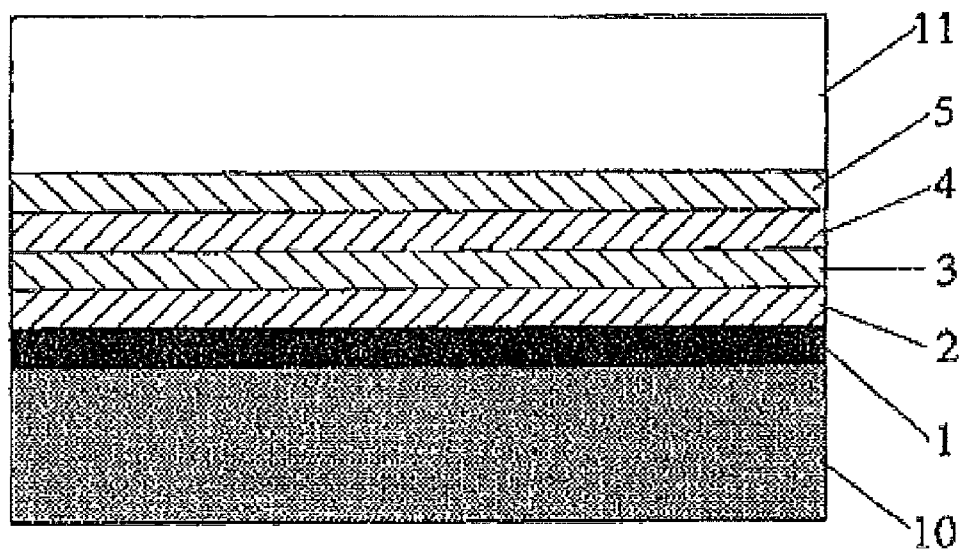
FIG. 2 shows a cross-section through a chuck in accordance with the invention with an anti-reflective coating formed of four films.

A further embodiment of the electrostatic chuck is shown as an example in FIG. 2 wherein a further silicon oxide film 5 is additionally inserted between the transparent cover 11 and the chromium oxide film 4.

FIG. 3 depicts an embodiment of how the surface of the transparent cover of the electrostatic chuck can be studied by an optical, interferometric measuring method.

Figure 4:
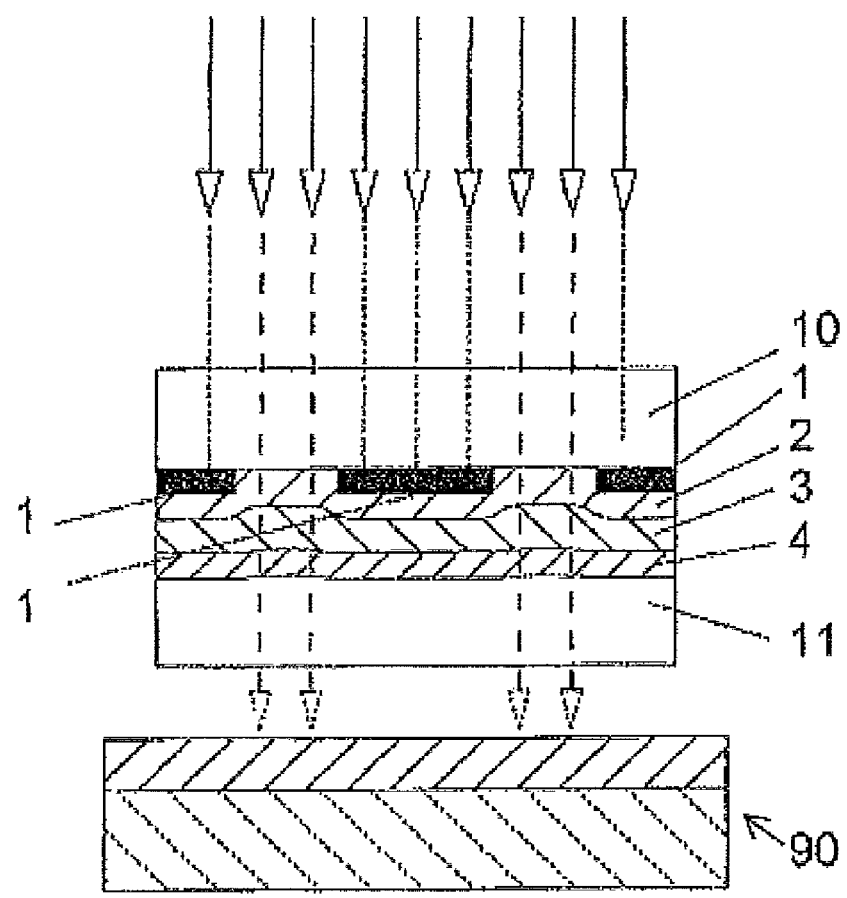
FIG. 4 depicts one embodiment of the electrostatic chuck holding one silicon or GaAs or glass wafer during lithographic processes.

FIG. 4 depicts one example of an application of the electrostatic chuck holding one silicon or GaAs or glass wafer during lithographic processes, for structured illumination.

If required (e.g. for silicate or direct bonding), a further silicon oxide film 5 (thickness approximately 100 nm) can be inserted between film 4 and layer 11.

This $SiO_2$ film 5 can also be applied by itself directly on the chromium metal film without additional films 2, 3 and 4 if only silicate or direct bonding of glass or glass ceramic 11 is to be achieved and the anti-reflective property plays no part. In principle, $Al_2O_3$ can be used instead of $SiO_2$.

Also, the above-described embodiments have been described in order to allow easy understanding of the present invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. An electrostatic chuck comprising:
   a substrate;
   a base layer comprised of a metal applied on the substrate;
   a first film of a chromium oxide applied on at least a portion of the base layer;
   a second film of at least one of a silicon oxide and an aluminum oxide applied on at least a portion of the first film; and
   a transparent cover.

2. The electrostatic chuck of claim 1 further comprising:
   a third film of chromium oxide applied on at least a portion of the second film.

3. The electrostatic chuck of claim 2 further comprising:
   a fourth film of at least one of silicon oxide and aluminum oxide applied on at least a portion of the third film.

4. The electrostatic chuck of claim 1, wherein the transparent cover is selected from the group consisting of glass, glass ceramics, silicon dioxide, $CaF_2$, ZnSe, non-linear optical crystals, diamond, optical synthetics, and cyclo-olefin polymers and copolymers.

5. The electrostatic chuck of claim 1, wherein the substrate is selected from the group consisting of glass, glass ceramics, silicon dioxide, $CaF_2$, ZnSe, non-linear optical crystals, diamond, optical synthetics, polycarbonate, and cyclo-olefin polymers and copolymers.

6. The electrostatic chuck of claim 1, wherein the base layer has a film thickness of 1 to 10,000 nm.

7. The electrostatic chuck of claim 1, wherein the base layer has a film thickness of 20 to 200 nm.

8. The electrostatic chuck of claim 1, wherein the first film has a film thickness of 30 to 120 nm.

9. The electrostatic chuck of claim 1, wherein the first film has a film thickness of 50 to 75 nm.

10. The electrostatic chuck of claim 1, wherein the second film has a film thickness of 50 to 200 nm.

11. The electrostatic chuck of claim 1, wherein the second film has a film thickness of 50 to 75 nm.

12. The electrostatic chuck of claim 2, wherein the third film has a film thickness of 0.1 to 50 nm.

13. The electrostatic chuck of claim 2, wherein the third film has a film thickness of 10 to 20 nm.

14. The electrostatic chuck of claim 3, wherein the fourth film has a film thickness of 1 to 10,000 nm.

15. The electrostatic chuck of claim 1, wherein the transparent cover has a film thickness of 1 to 1,000 µm.

16. The electrostatic chuck of claim 1, wherein the base layer is selected from materials from the group consisting of Ti, Cr, Ni, Mo, Ta, W, Al, Sn and alloys thereof, semiconductors, and electrically conductive oxides.

17. The electrostatic chuck of claim 1, wherein the transparent cover is at least one of silicate bonded and direct bonded to a layer thereunder.

18. The electrostatic chuck of claim 1, wherein an adhesive used in bonding has an index of refraction essentially equal to an index of refraction of the transparent cover.

19. The electrostatic chuck of claim 1, wherein the first film consists essentially of chromium oxide.

20. The use of the electrostatic chuck of claim 1 in lithographic processes, for structured illumination, comprised of:
   processing a silicon or GaAs or glass wafer;
   handling the wafer, or a component that has been produced from the wafer, by the electrostatic chuck, wherein part of the handling takes place in a vacuum or inert gas environment.

21. A method for a topographical measurement of a surface of a transparent cover of an electrostatic chuck comprised of:
   using a Fizeau interferometer to illuminate the chuck with a light source at a perpendicular angle onto the surface of the transparent cover;
   reflecting radiance from the light source essentially only by the surface of the transparent glass cover; and
   eliminating the portion of a light beam passing through the transparent cover by destructive interference at anti-reflective coatings so that virtually no reflection can be observed from a reflective metal electrode.

* * * * *